(12) United States Patent
Fujio et al.

(10) Patent No.: US 7,148,552 B2
(45) Date of Patent: Dec. 12, 2006

(54) HIGH VOLTAGE TRANSISTOR HAVING SIDE-WALL WIDTH DIFFERENT FROM SIDE-WALL WIDTH OF A LOW VOLTAGE TRANSISTOR

(75) Inventors: Masayuki Fujio, Fukuyama (JP); Motoharu Arimura, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 37 days.

(21) Appl. No.: 10/848,248

(22) Filed: May 17, 2004

(65) Prior Publication Data
US 2004/0232511 A1 Nov. 25, 2004

(30) Foreign Application Priority Data
May 21, 2003 (JP) .............................. 2003-143113

(51) Int. Cl.
H01L 29/00 (2006.01)
(52) U.S. Cl. ...................... 257/500; 257/501; 257/900
(58) Field of Classification Search ................ 257/391, 257/392, 500, 501, 900
See application file for complete search history.

(56) References Cited
U.S. PATENT DOCUMENTS
6,010,929 A * 1/2000 Chapman .................... 438/226

2004/0212019 A1* 10/2004 Shinohara et al. .......... 257/368

FOREIGN PATENT DOCUMENTS
JP 2001-93984 4/2001

* cited by examiner

Primary Examiner—Hoai Pham
(74) Attorney, Agent, or Firm—Morrison & Foerster LLP

(57) ABSTRACT

The present invention has an object to provide a semiconductor device that is equipped with a high breakdown voltage transistor of a high junction breakdown voltage characteristic and a low voltage transistor of a high electric current drive characteristic to thereby ensure the element isolation performance in the both transistor forming regions. The semiconductor device is equipped with a high breakdown voltage transistor (a) and low voltage transistor (b) the widths of whose side walls are different from each other. The side walls of the high breakdown voltage transistor (a) each consist of four layers of first side wall film, second side wall film, third side wall film, and fourth side wall film that are formed in such a way that they are laminated from both side surfaces of a gate electrode in directions that are sidewardly remote away from this gate electrode. The side walls of the low voltage transistor (b) each consist of three layers of the first side wall film, the second side wall film, and the fourth side wall film that are formed in such a way that they are laminated from both side surfaces of a gate electrode in directions that are sidewardly remote away from this gate electrode.

5 Claims, 14 Drawing Sheets (a) high breakdown voltage transistor (b) low voltage transistor

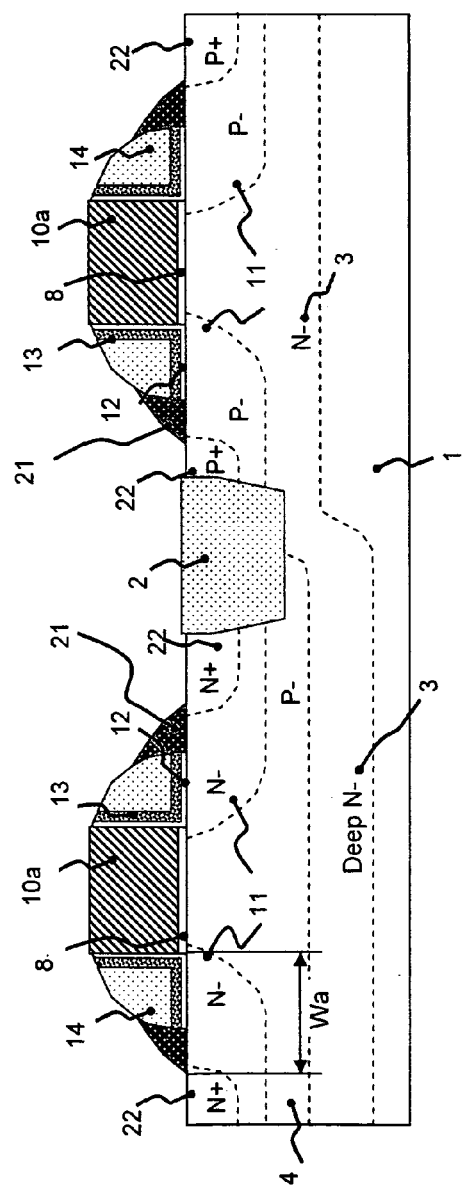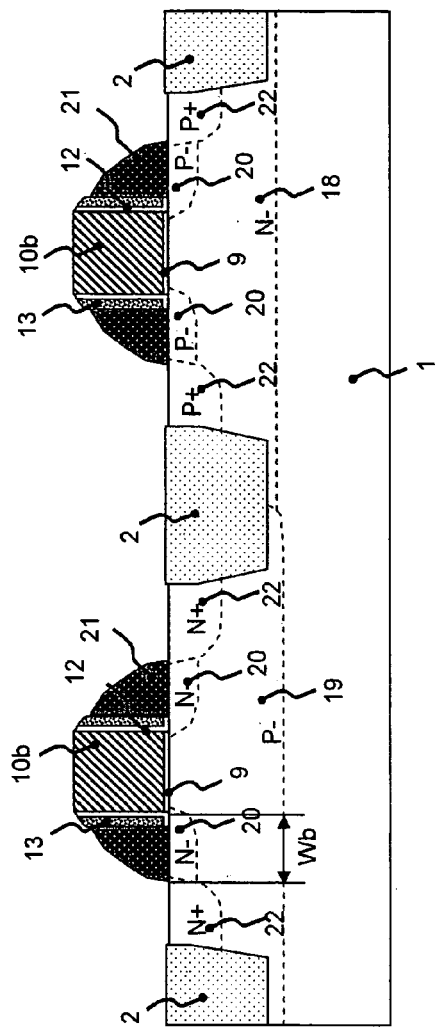
F I G. 1

(a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor (a) high breakdown voltage transistor (b) low voltage transistor

HIGH VOLTAGE TRANSISTOR HAVING SIDE-WALL WIDTH DIFFERENT FROM SIDE-WALL WIDTH OF A LOW VOLTAGE TRANSISTOR

BACKGROUND OF THE INVENTION

1. Field of the Invention

The present invention relates to a semiconductor device that is equipped with a high breakdown voltage transistor and a low voltage transistor, the side wall widths of which are different from each other and a method of manufacturing the same. More particularly, the invention concerns a semiconductor device wherein a high voltage drive circuit and a low voltage drive circuit are co-loaded on the same chip and a method of manufacturing the same. Further, the invention concerns a semiconductor device wherein a non-volatile memory cell array is integrated and a method of manufacturing the same.

2. Description of the Related Art

There has in recent years been an increasing demand for a semiconductor integrated circuit wherein, together with a non-volatile memory cell array, a logic circuit that is driven with a high speed is co-loaded on the same chip to thereby enhance the added value.

In this type of semiconductor device, as the peripheral circuits for a memory cell array, there is used a high breakdown voltage transistor that composes a drive circuit, etc. that handles a high voltage (program/erasure, etc.) that is needed for driving the memory cell, as well as a low voltage transistor circuit that composes a logic circuit, etc. that operates with a low voltage and with a high speed.

A high breakdown voltage transistor, as described above, is used to generate and transfer ten and odd volts of voltage as at the time of program/erasure operation with respect to the memory cell. In this connection, regarding a non-volatile memory, ensuring the reliability with which that memory becomes error-free with respect to the program/erasure that is performed several tens of thousands of times or more is demanded the most. For this reason, regarding the junction breakdown voltage of the high breakdown voltage transistor that handles a high level of voltage, it is necessary to sufficiently ensure such junction breakdown voltage.

For solving the above-described problems, in the official gazette of Japanese Unexamined Patent Publication No. 2001-93984, there is disclosed a method of individually separately fabricating the side wall width, namely structuring in such a way that the side wall width of the high breakdown voltage transistor is made wider than the side wall width of the low voltage transistor. The conventional manufacturing process that is disclosed in the official gazette of Japanese Unexamined Patent Publication No. 2001-93984 will briefly be explained using FIGS. 11 to 14. Incidentally, in these figures, the figures (a) illustrate a sectional view of process step for the high breakdown voltage transistor while the figures (b) illustrate a sectional view of process step for the low voltage transistor.

First, as shown in FIGS. 11(a) and 11(b), with respect to a semiconductor substrate 101 that has an element isolation region 102, an N well 103 and P well 104 of the high breakdown voltage transistor region (a), and an N well layer 118 and P well layer 119 of the lower voltage transistor region (b), there are formed the element isolation regions 102, gate insulation films 109 and gate electrodes 110b for the low voltage transistor, as well as gate insulation films 108 and gate electrodes 110a for the high breakdown voltage transistor.

Next, as shown in FIGS. 12(a) and 12(b), selective LDD injection (impurity injection) is performed, using the respective gate electrodes as masks, with respect to the low voltage transistor and high breakdown voltage transistor to thereby form LDD regions 111 and 120. Incidentally, when forming this LDD region, it is formed more deeply on the high breakdown voltage transistor side than on the low voltage one side.

Next to this, as shown in FIGS. 13(a) and 13(b), a first insulative film 112 for use as the side wall that consists of a silicon oxide film, silicon nitride film, or the like is formed. Then, the insulative film 112 in the region for forming therein the low voltage transistor is removed, to thereby leave the insulative film in only the high breakdown voltage transistor region. Here, for that partial removal of the first insulative film 112 in the low voltage transistor region, there is employed a method wherein a photo-resist 115 having an opening in only the low voltage transistor region is formed; and, using it as the mask, wet etching is performed up to midway in the insulative film; and thereafter dry etching is performed to thereby perform that removal. Or, alternatively, there is employed a method wherein, using a silicon nitride film or silicon nitride oxide film as the insulative film, it is arranged that, even when a technique of anisotropic etching is used, the backing element isolation insulative film 102 be prevented from being excessively etched.

Next to this, a second insulative film 113 is deposited on the entire surface of the substrate, then the entire resulting surface of it is etched back. As a result of this, side walls the widths of that are different from each other are formed, respectively, with respect to the low voltage transistor region and high breakdown voltage transistor region.

Thereafter, as shown in FIGS. 14(a) and 14(b), using the gate electrode and side walls as the mask, there is performed injection of the high-concentration impurity for forming the source and drain regions. Then, although not illustrated, the resulting surface of the substrate is salicided to thereby perform covering an insulative film over the entire resulting surface using a CVD technique or the like. Then, contact holes are formed there and an electrically conductive film is embedded into there, and prescribed electrodes are connected to there, thereby a semiconductor device that is equipped with the high breakdown voltage transistor and low voltage transistor is obtained.

In a case where using this conventional technique, in the high breakdown voltage transistor, the low-concentration diffusion layer (LDD) is deeply diffused and simultaneously the distance from the high-concentration diffusion layer (source/drain region) to the forward end of the low-concentration diffusion layer is taken to be long. As a result of this, the depletion layer become easy to get spread, with the result that a sufficiently high level of junction breakdown voltage is ensured. On the other hand, in the low voltage transistor, it is possible to form a high-performance logic transistor in that, by the shallow LDD layer, there is suppressed the loss of the driving electric current as well as the deterioration in the short channel characteristic.

However, in the above-described conventional method, in a case where the non-volatile semiconductor memory device and low voltage logic circuit have been co-loaded on the same one chip, the following inconvenience arises. Namely, when eliminating the first side wall film in the low voltage transistor region, since there is not the stopper film, or the like, that protects the element isolation insulative film, it is in actuality difficult, regarding stopping etching at the position of element isolation insulative film, to perform control for that stopping. This raised the problem that, during the manufacturing process steps, the element isolation insulative film was excessively etched and in consequence it caused deterioration of the element-isolating performance.

In addition, when in the low voltage transistor as in the case of the high breakdown voltage transistor LDD injection for forming the low-concentration region is performed after forming the gate electrode, in the heat treating process step that is performed, for example, at the time of thereafter forming the side walls the impurity is diffused right under the gate or the concentration becomes thin. Resultantly, the short channel effect becomes great or the performance of the transistor deteriorates, such as, the driving electric current becomes insufficient. These obstructed micronizing the transistor.

On the other hand, injecting the LDD in the low voltage transistor with the first side wall film being left thereon as is causes the following inconvenience. Even after the execution of the thereafter-succeeding heat treatment, since the low-concentration diffusion region has difficulty going around into up to right beneath the channel, this causes the increase in the effective channel length. This is followed by the rise in the threshold voltage as well as by the deterioration in the electric current driving ability of the transistor. This disables obtaining a desired transistor.

SUMMARY OF THE INVENTION

The present invention has been made in view of the above-described problems and has an object to provide a semiconductor device that, in the arrangement equipped with a high breakdown voltage transistor and a low voltage transistor, is equipped, while ensuring the element isolation performance in the both transistor forming regions, with a high breakdown voltage transistor of a high junction breakdown voltage characteristic and a low voltage transistor of a high electric current driving characteristic, and a method of manufacturing the semiconductor device.

A semiconductor device according to the present invention for attaining the above object comprises a high breakdown voltage transistor and low voltage transistor the widths of whose side walls are different from each other, and in which the side walls of the high breakdown voltage transistor are formed in the way of including four layers of first side wall film, second side wall film, third side wall film, and fourth side wall film, or three layers of second side wall film, third side wall film, and fourth side wall film, in such a way that they are laminated from both side surfaces of a gate electrode in directions that are sidewardly remote away from this gate electrode, while the side walls of the low voltage transistor is formed in the way of including three layers of the first side wall film, the second side wall film, and the fourth side wall film, or two layers of the second side wall film and the fourth side wall film, in such a way that they are laminated from both side surfaces of a gate electrode in directions that are sidewardly remote away from this gate electrode. Here, in the semiconductor device according to the present invention, it is preferable that the second side wall film is a silicon nitride film and the third side wall film is a silicon oxide film. Further, it is preferable that the second side wall film be formed to a width of 10 nm or less.

According to the semiconductor device according to the present invention, by structuring it in such a way that the relevant transistors of different breakdown voltage specifications have side walls whose widths are different from each other, on the high breakdown voltage transistor side the breakdown voltage performance becomes again higher while on the low voltage transistor side the parasitic resistance becomes small, whereby a high driving electric current is ensured. In addition, for that reason, reducing the element in size becomes possible. As a result of that, it is possible to obtain a semiconductor device that has excellent element isolation performance and that is high in reliability and high in performance.

A method of manufacturing a semiconductor device according to the present invention for attaining the above object is the one of manufacturing a semiconductor device including a high breakdown voltage transistor and low voltage transistor the widths of whose side walls are different from each other, which comprises a first step of forming a first gate-insulating film and first gate electrode for use for the high breakdown voltage transistor, and a second gate-insulating film for use for the low voltage transistor the thickness of that is smaller than that of the first gate-insulating film and a second gate electrode; a second step of introducing into a semiconductor substrate in the high breakdown voltage transistor forming region an impurity of a conductivity type opposite to that of that semiconductor substrate to thereby form a first LDD region; a third step of respectively forming side wall films, becoming side walls, on respective gate electrodes of the low voltage transistor and high breakdown voltage transistor; a fourth step of removing the side wall film of the low voltage transistor forming region that has been formed in the third step; a fifth step of selectively introducing into a semiconductor substrate in the low voltage transistor forming region an impurity of a conductivity type opposite to that of that semiconductor substrate to thereby form a second LDD region; and a sixth step of, after forming side walls, again, on each of the respective gate electrodes of the low voltage transistor and high breakdown voltage transistor, forming source and drain of each of the high breakdown voltage transistor and low voltage transistor. Here, in the manufacturing method for semiconductor according to the present invention, it is preferable that, in the third step, the first, second, and third side wall films, or second and third side wall films, be lamination deposited; and, in at least the high breakdown voltage transistor forming region, anisotropic etching be performed on the third side wall film until the surface of the second side wall film becomes exposed; and, in the fourth step, the third side wall film that has been laminated, in the third step, on the low voltage transistor forming region, be eliminated, with anisotropic etching, using as the mask the photo-resist having an opening at the position corresponding to the low voltage transistor forming region. Further, it is preferable that the second side wall film be a silicon nitride film; and the third side wall film be a silicon oxide film; and that the second side wall film be formed to a width of 10 nm or less.

Incidentally, when reference is made to the "semiconductor substrate" in the manufacturing method for a semiconductor device according to the present invention, that wording is defined to include the "well" region.

The manufacturing method for a semiconductor device according to the present invention, when forming the side walls the widths of that are difference, in its preferred embodiment, has a step of, with the stopper film consisting of a high selectivity silicon nitride film being formed, beforehand, as the lower layer of, and inside, the side walls of the low voltage transistor region, eliminating the side walls consisting of a silicon oxide film with use of isotropic etching that is thereafter performed. As a result of this, by structuring in such a way that the relevant transistors of different breakdown voltage specifications have side walls whose widths are different from each other, on the high breakdown voltage transistor side the breakdown voltage performance becomes again higher while on the low voltage transistor side the parasitic resistance becomes small, whereby a high driving electric current is ensured. In addition, for that reason, reducing the element in size becomes possible. As a result of that, it is possible to obtain a semiconductor device that has excellent element isolation performance and that is high in reliability and high in performance.

Also, according to the manufacturing method for semiconductor device according to the present invention, since excessively etching the backing element isolation insulating film is prevented, a semiconductor device in that no defects occur; the element isolation performance doesn't deteriorate; and the yield is good is obtained. Further, as a result of the processing that the side walls are eliminated once and, after high-temperature thermal treatment such as in the CVD process step has been performed, LDD injection is performed in such a way as self-alignment occurs with the gate electrode having thin side walls of the low voltage transistor, each of the high breakdown voltage transistor and low voltage transistor is subject to individual and separate LDD injection and thermal treatment. Therefore, above all, in the low voltage transistor, it is possible to manufacture a transistor having a very small value of gate length that has the short channel effect suppressed as a result of being freed from the thermal treatment.

BRIEF DESCRIPTION OF THE DRAWINGS

FIGS. 1(a) and 1(b) are views typically illustrating respective structures of a high breakdown voltage transistor and low voltage transistor in an embodiment of a semiconductor device according to the present invention;

DETAILED DESCRIPTION OF THE PREFERRED EMBODIMENTS

Figure 2:
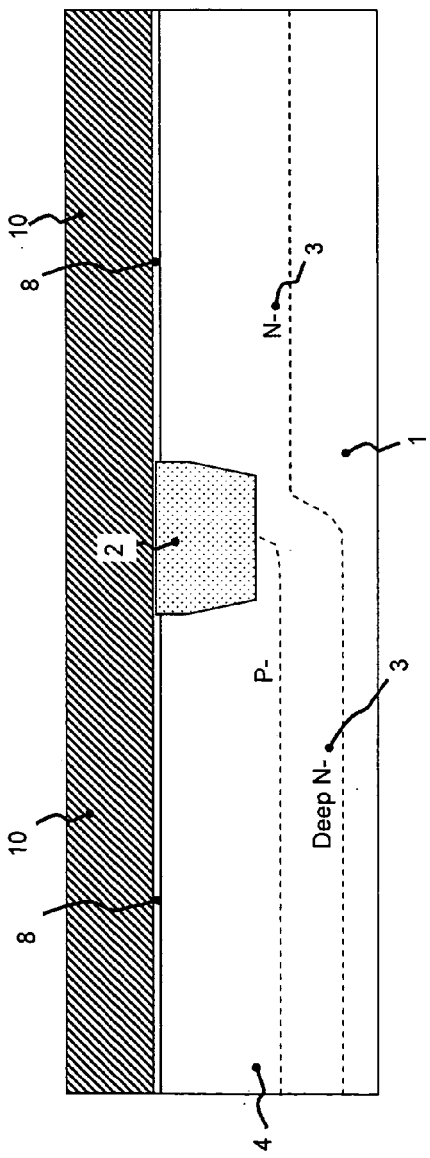
FIGS. 2(a) and 2(b) are sectional views of process step illustrating in the order of process steps the process of fabricating the high breakdown voltage transistor and low voltage transistor in an embodiment of a method of manufacturing the semiconductor device according to the present invention.
Figure 2:
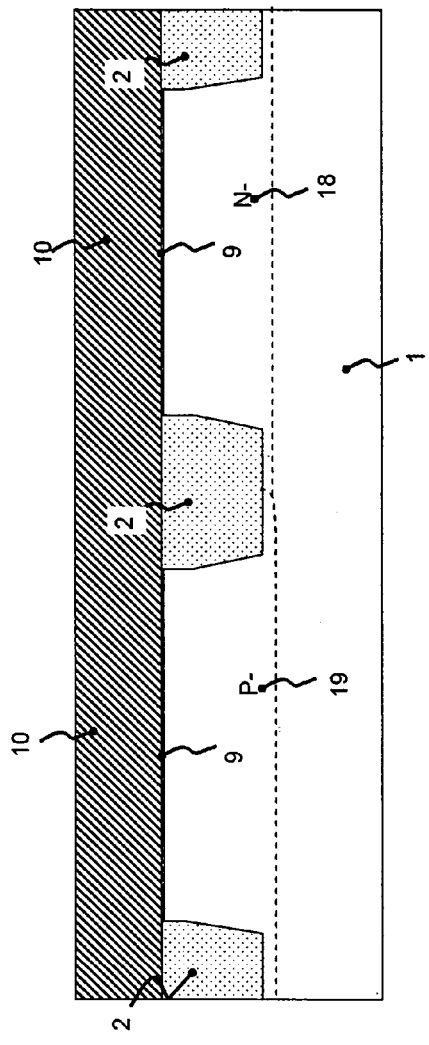

Hereinafter, an embodiment of a semiconductor device, and that of a method of manufacturing the semiconductor device (hereinafter referred to suitably as "the invention device" and "the invention method", respectively), according to the present invention, will be explained with reference to the drawings.

(First Embodiment)

In FIGS. 1(a) and 1(b), there are shown respective sectional structures of a high breakdown voltage transistor and low voltage transistor of the invention device. FIG. 1 illustrates an example wherein the invention has been applied to a co-loaded device wherein the high breakdown voltage transistor circuit and a high-speed logic circuit are co-loaded. Incidentally, in FIG. 1, the left side is the high breakdown voltage transistor (a) and the right side is the low voltage transistor (b). Also, in the FIGS. 1(a) and 1(b), the contact holes for having metal interconnection performed with respect to the source/drain electrodes of each of the transistors, the metal interconnection layer, the interlayer insulation films, the protective films, etc. are description omitted.

In the high breakdown voltage transistor (a), as the side wall of a gate electrode 10a, there are sequentially laminated from each of both side surfaces of the gate electrode 10a in the direction that is sidewardly remote away from it, for example, a silicon oxide film (first side wall film 12) the thickness of that is 5 nm, a silicon nitride film (second side wall film 13) the thickness of that is 5 nm, a silicon oxide film (third side wall film 14) the thickness of that is 100 nm and that is located the next, and a silicon oxide film (fourth side wall film 21) the thickness of that is 100 nm and that is located the next, and the total width Wa of the entire side wall is set to be 210 nm.

On the other hand, in the low voltage transistor (b), as the side wall of a gate electrode 10b, there are sequentially laminated from each of both side surfaces of the gate electrode 10b in the direction that is sidewardly remote away from it, for example, a silicon oxide film (first side wall film 12) the thickness of that is 5 nm, a silicon nitride film (second side wall film 13) the thickness of that is 5 nm, and a silicon oxide film (fourth side wall film 21) the thickness of that is 100 nm and that is located the next, and the total width Wa of the entire side wall is set to be 110 nm.

Since, as described above, in the high breakdown voltage transistor (a) the width Wa of the side wall is wide, the distance from a high-concentration diffusion layer 22 located outside and under the side wall to a forward end of a low-concentration diffusion layer 11 located under the side wall is an impurity profile that is lengthy and gentle. Therefore, the junction breakdown voltage doesn't deteriorate.

On the other hand, in the low voltage transistor (b), it is constructed in such a way that it has a minute and fine gate length and a relatively small width Wb of side wall, so it is possible to make small the area of the low voltage transistor region. Simultaneously, since a low-concentration diffusion layer 20 of the low voltage transistor can be made short on account of a thin side wall 25, the parasitic resistance is suppressed and in addition the electric-current driving ability is not decreased, either.

The manufacturing method for the invention device (the invention method) shown in FIG. 1 will now be explained using the process step sectional views of FIGS. 2 to 10.

First, as shown in FIGS. 2(a) and 2(b), on the P-type semiconductor substrate 1 having an element-isolation region 2 and an N well 3 and P well 4 of the high breakdown voltage transistor region (a) as well as an N well layer 18 and P well layer 19 of the low voltage transistor region (b), there are formed the gate oxide film 8 of the high breakdown voltage transistor (a) and the gate oxide film 9 of the low voltage transistor (b). Thereafter, polysilicon 10 is deposited on the substrate. Incidentally, the impurity concentration of the N well 3 and P well 4 of the high breakdown voltage transistor has a concentration that is lower than that of the N well 18 and P well 19 of the low voltage transistor and in addition has a concentration profile that is deeper than that of the latter. Also, the gate oxide film 8 of the high breakdown voltage transistor (a) is thicker than the gate oxide film 9 of the low voltage transistor (b).

Figure 3:
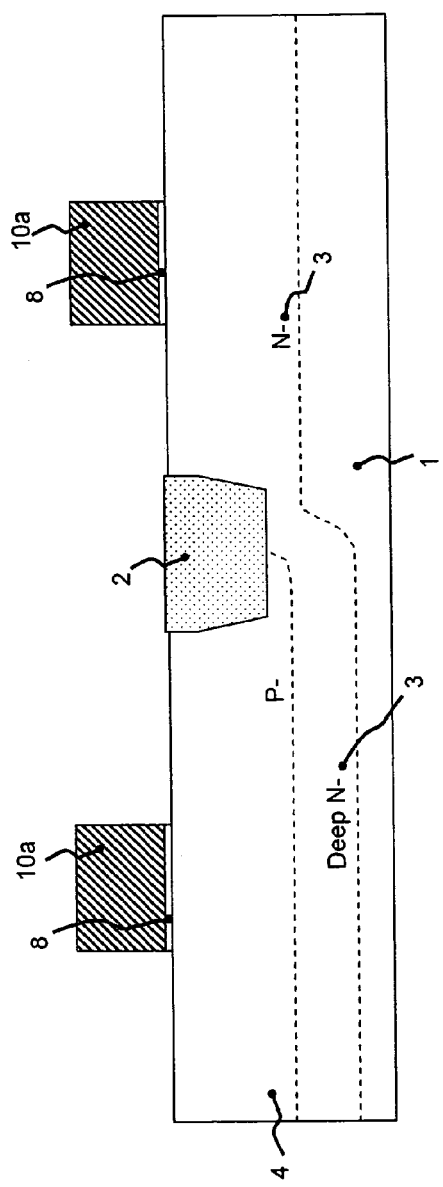
FIGS. 3(a) and 3(b) are sectional views of process step illustrating in the order of process steps the process of fabricating the high breakdown voltage transistor and low voltage transistor in the embodiment of a method of manufacturing the semiconductor device according to the present invention.
Figure 3:
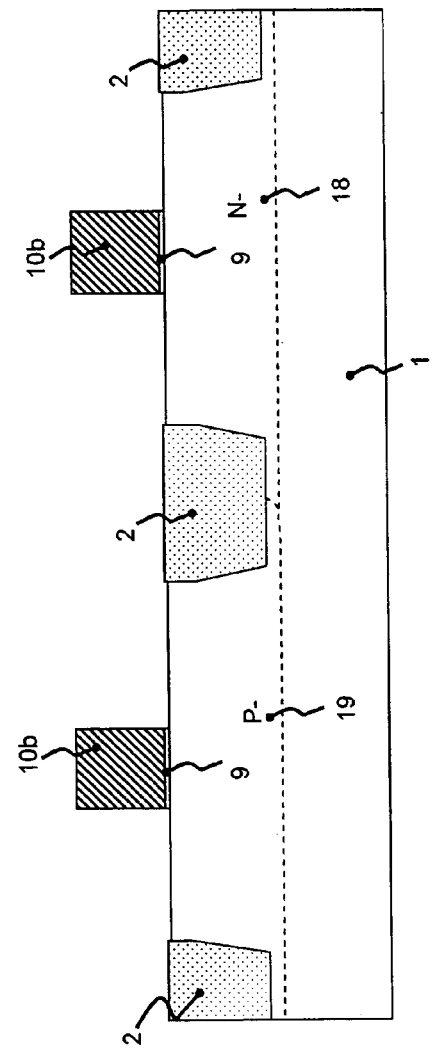
Figure 4:
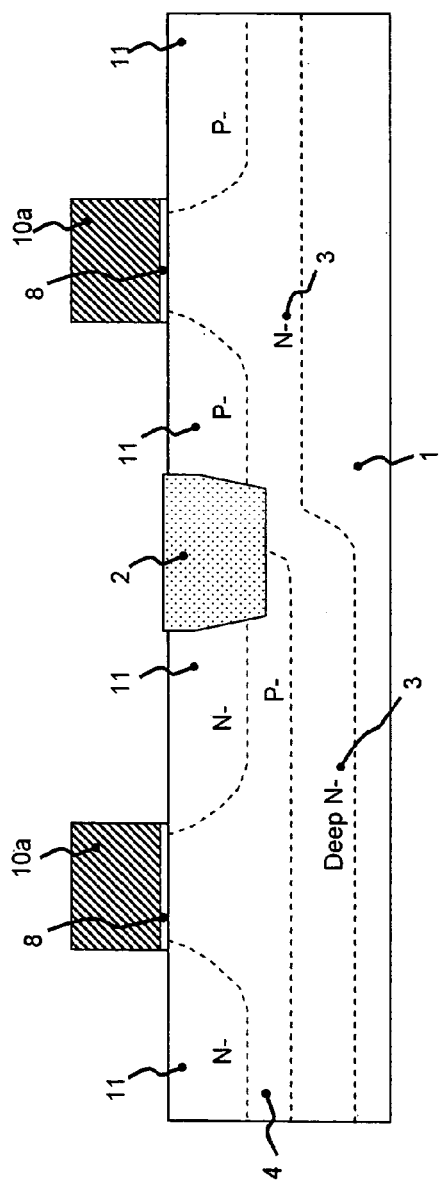
FIGS. 4(a) and 4(b) are sectional views of process step illustrating in the order of process steps the process of fabricating the high breakdown voltage transistor and low voltage transistor in the embodiment of a method of manufacturing the semiconductor device according to the present invention.
Figure 4:
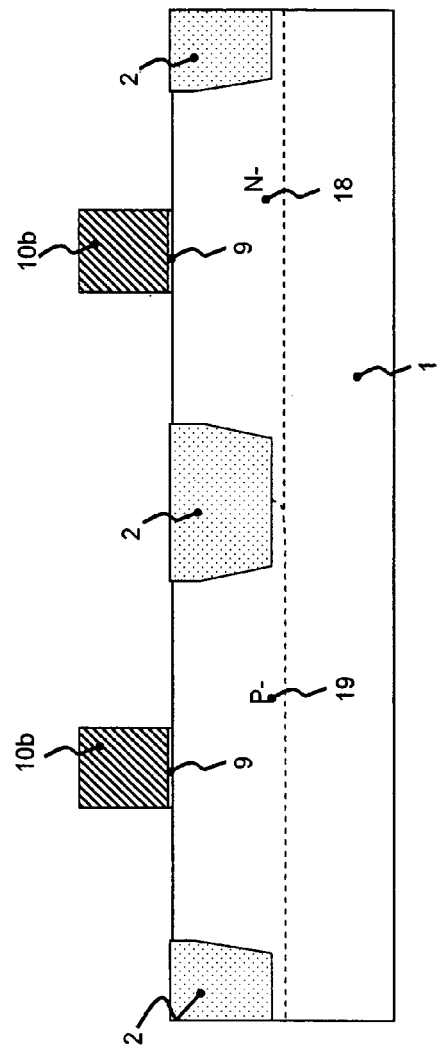
Figure 5:
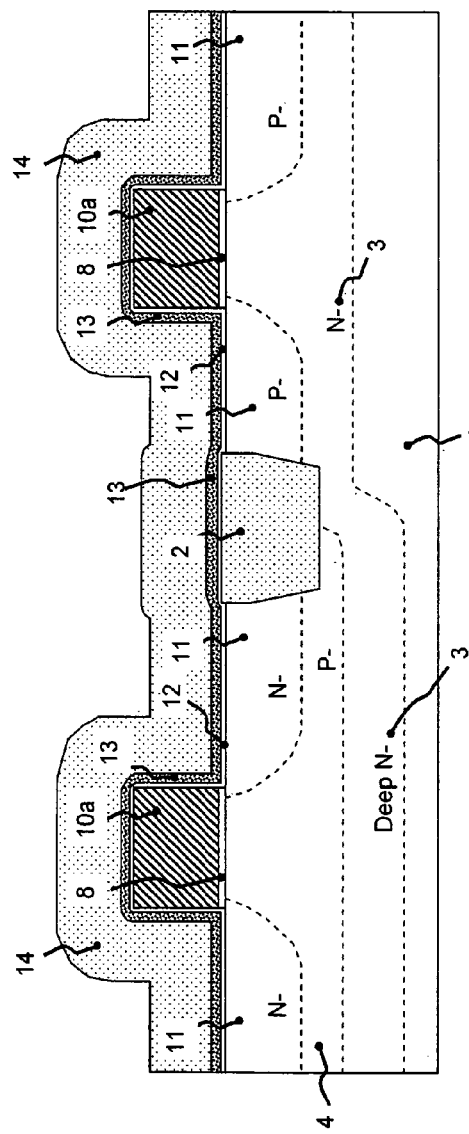
FIGS. 5(a) and 5(b) are sectional views of process step illustrating in the order of process steps the process of fabricating the high breakdown voltage transistor and low voltage transistor in the embodiment of a method of manufacturing the semiconductor device according to the present invention.
Figure 5:
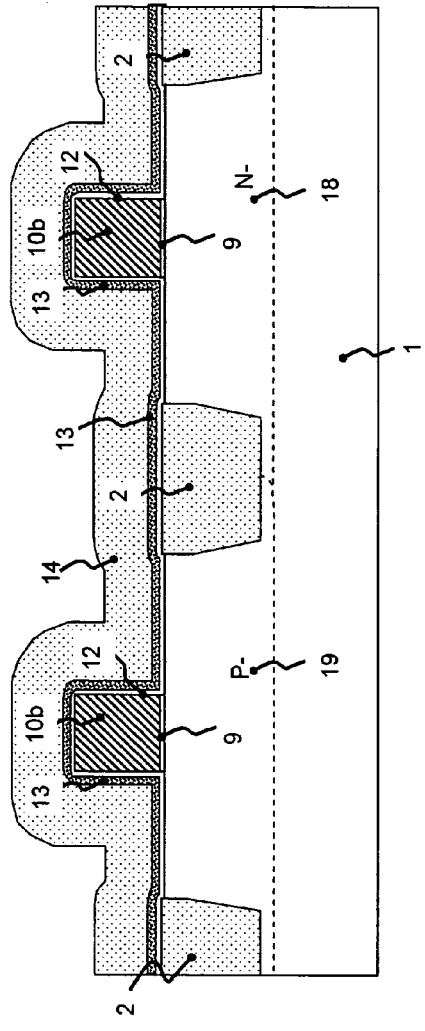
Figure 6:
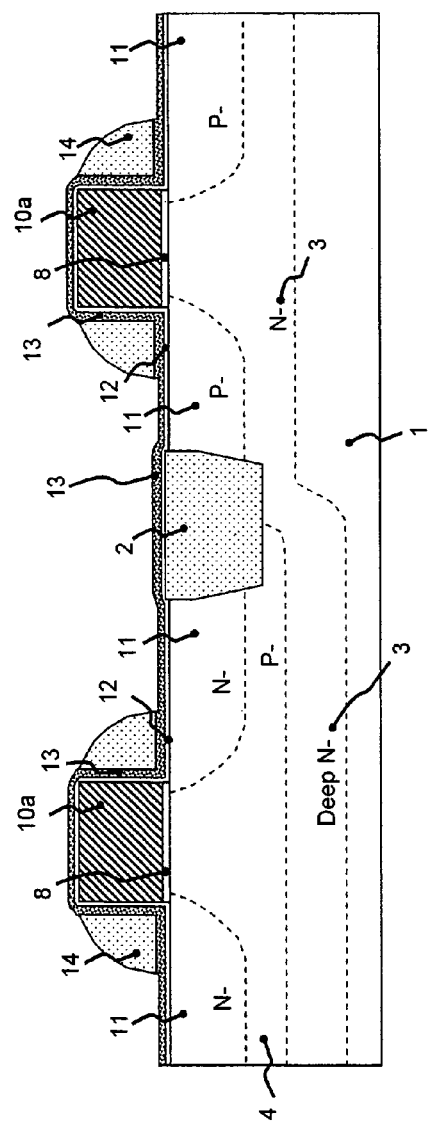
FIGS. 6(a) and 6(b) are sectional views of process step illustrating in the order of process steps the process of fabricating the high breakdown voltage transistor and low voltage transistor in the embodiment of a method of manufacturing the semiconductor device according to the present invention.
Figure 6:
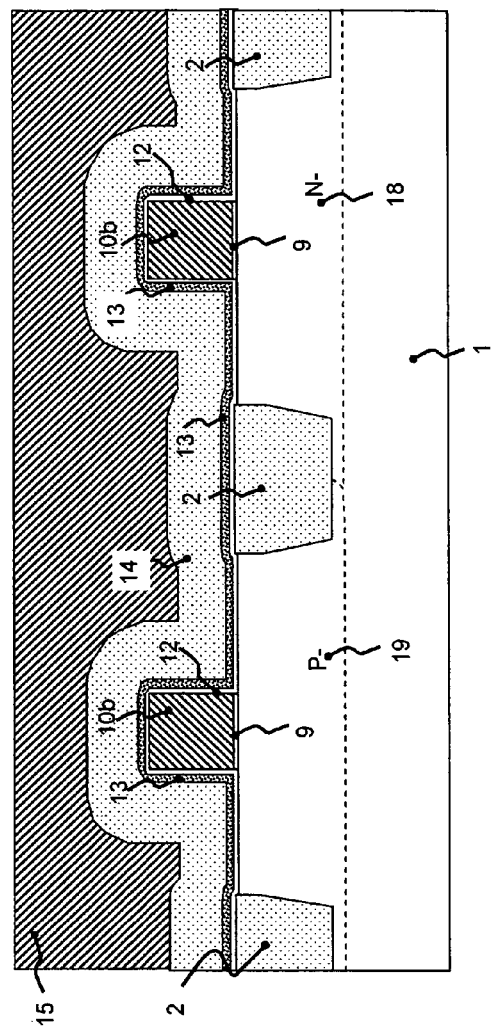
Figure 7:
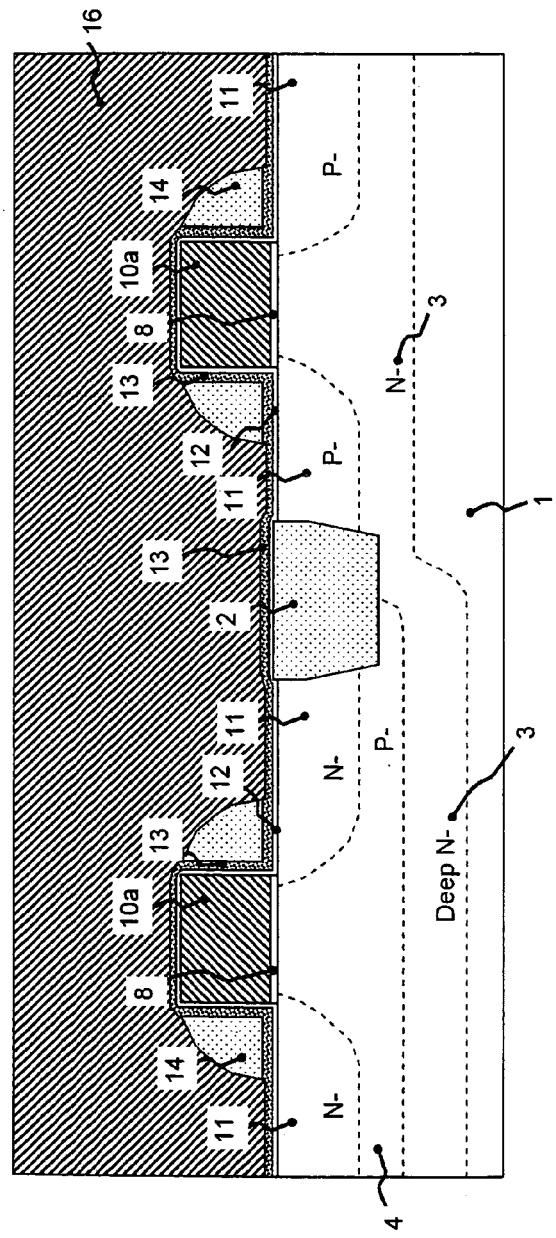
FIGS. 7(a) and 7(b) are sectional views of process step illustrating in the order of process steps the process of fabricating the high breakdown voltage transistor and low voltage transistor in the embodiment of a method of manufacturing the semiconductor device according to the present invention.
Figure 7:
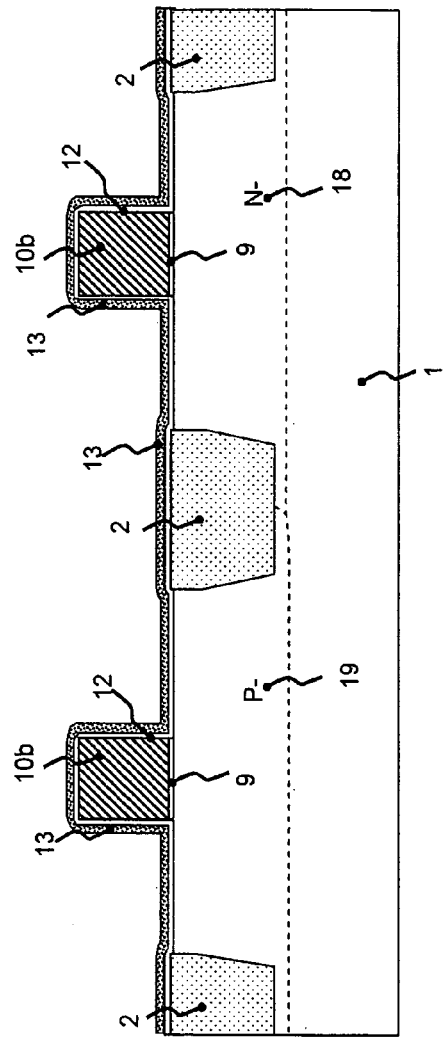
Figure 8:
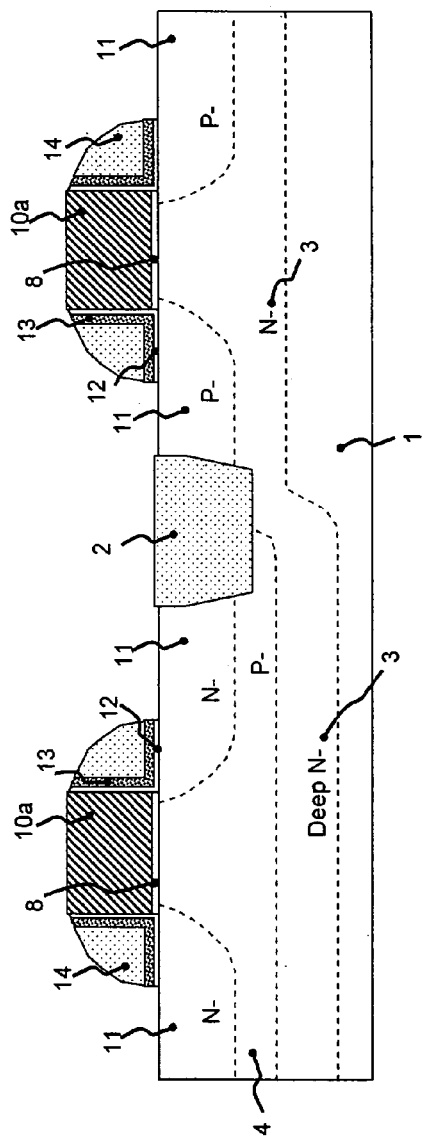
FIGS. 8(a) and 8(b) are sectional views of process step illustrating in the order of process steps the process of fabricating the high breakdown voltage transistor and low voltage transistor in the embodiment of a method of manufacturing the semiconductor device according to the present invention.
Figure 8:
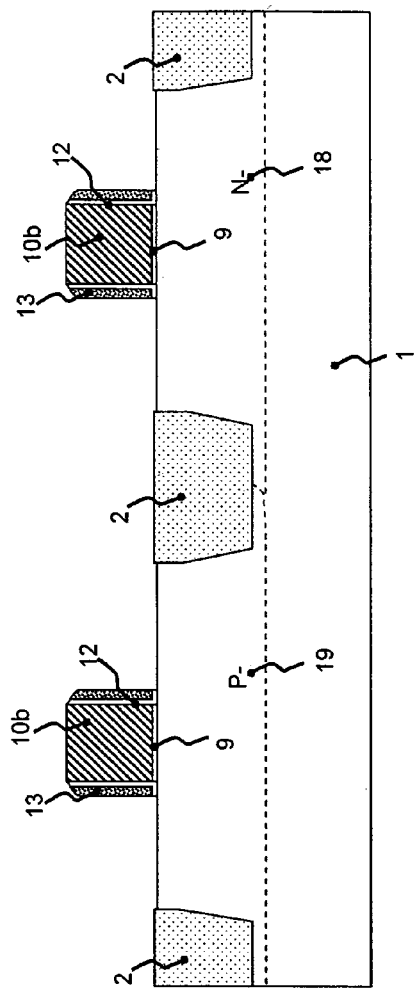

Next, as shown in FIG. 3, there are formed the gate electrode 10a of the high breakdown voltage transistor (a) and the gate electrode 10b of the low voltage transistor (b). The process steps that are shown in FIGS. 2 and 3 correspond to the first series of process steps of the invention method.

Subsequently, as shown in FIGS. 4(a) and 4(b), with respect to the gate electrode 10a of the high breakdown voltage transistor region (a), desired ion implantation is performed, on a self-aligning basis, for forming a low-concentration diffusion region. Concretely, in the NMOS transistor, for example, phosphorus ($31P^+$) is ion implanted vertically to the substrate at a level of implantation energy of 50 to 70 KeV and in an amount of implantation that is on the order of $10^{13}$ cm$^{-2}$, while, on the other hand, in the PMOS transistor, for example, boron ($11B^+$) is ion implanted vertically to the substrate at a level of implantation energy of 20 to 30 KeV and in an amount of implantation that is on the order of $10^{13}$ cm$^{-2}$. By doing so, an LDD that becomes the low-concentration diffusion layer 11 of the high breakdown voltage transistor is formed. The above-described LDD forming process steps that are shown in FIGS. 4(a) and 4(b) correspond to a second series of process steps of the invention method.

Subsequently, as shown in FIGS. 5(a) and 5(b), on the entire surface of the substrate, there are sequentially deposited, as a first side wall film 12, for example, a silicon oxide film to a thickness of 5 nm, as a second side wall film 13, a silicon nitride film to a thickness of 10 nm (less than 10 nm or less is preferable), and, as a third side wall film 14, a silicon oxide film to a thickness of 100 nm. Regarding these side wall films, for example the first side wall film 12 is formed through oxidizing, and the second and third side wall films 13 and 14 are deposited using an LPCVD technique.

Subsequently, as shown in FIGS. 6(a) and 6(b), a photo-resist 15 having an opening in the region other than the low-voltage transistor region is formed. Then, using it as a mask, selective etching is performed, using anisotropic etching, with respect only to the third side wall film 14 (silicon oxide film). By doing so, leaving of side walls (side-wall forming of the third side wall film 14) is performed with respect to the side surface of the second side wall film 13 (silicon nitride film) of the gate electrode 10a of the high breakdown voltage transistor. Since at that point of time the second and third side wall films 13 and 14 of the low voltage transistor region were covered by the photo-resist 15, no side walls have been formed there. Incidentally, here, without forming the photo-resist 15, etching-back may be performed with respect to the entire surface of the third side wall film 14. By doing so, side walls may also be formed in advance with respect to the low voltage transistor, too, as in the case of the high breakdown voltage transistor. The above-described process steps that are shown in FIGS. 5(a), 5(b), 6(a), and 6(b) correspond to a third series of process steps of the invention method.

Next, as shown in FIGS. 7(a) and 7(b), a photo-resist 16 having an opening in only the low voltage transistor region (b) is formed to thereby remove by etching the silicon oxide film (third side wall film 14) formed on the side wall of the gate electrode 10b of the low voltage transistor. Removing this silicon oxide film is performing wet etching (an example of isotropic etching) by using an etchant that contains, for example, a hydrofluoric acid (HF).

This wet etchant has high selectivity with respect to the silicon nitride film (the second side wall film 13) that functions as a stopper film, therefore it is possible to suppress the decrease in the thickness of the second side wall film 13 to a value that is necessary and minimum. Therefore, since problems such that the etchant breaks through the stopper film or pin-holes occur in the element isolation insulative film 2 do not arise, it is possible to obtain a high level of manufacturing yield. The above-described process steps that are shown in FIGS. 7(a) and 7(b) correspond to a fourth series of process steps of the invention method.

Thereafter, as shown in FIGS. 8(a) and 8(b), the photo-resist 16 is removed, and anisotropic etching is performed with respect to the entire surface of the resulting mass, i.e. the silicon nitride film (the second side wall film 13) and silicon oxide film (the first side wall film 12) each of that remains to exist, for removing the same. Incidentally, in a case where performing etching with respect to the silicon nitride film using that anisotropic etching, since this film is as very thin as, for example, 10 nm or less, it doesn't happen that the insulative film in the element-isolating region will be excessively etched.

Also, removing the remaining silicon nitride film (the second side wall film 13) and silicon oxide film (the first side wall film 12) is not limited to that way of removal, and it needs only to be done by the point of time when converting the substrate and gate electrode into salicide.

Figure 9:
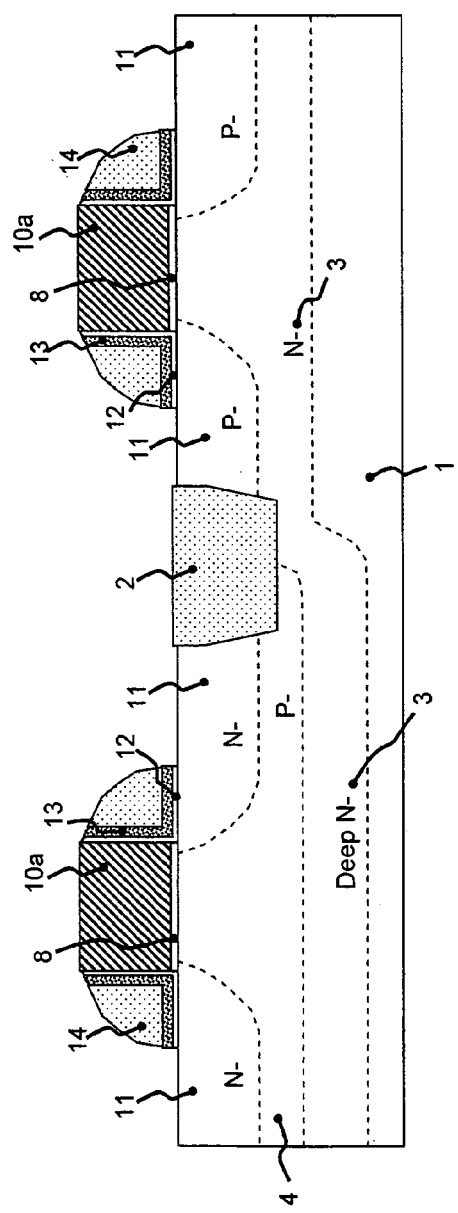
FIGS. 9(a) and 9(b) are sectional views of process step illustrating in the order of process steps the process of fabricating the high breakdown voltage transistor and low voltage transistor in the embodiment of a method of manufacturing the semiconductor device according to the present invention.
Figure 9:
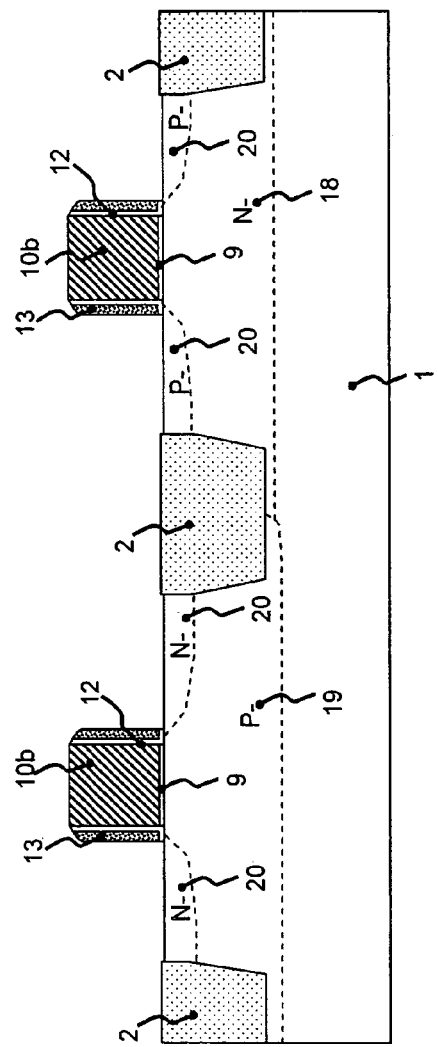

Subsequently, as shown in FIGS. 9(*a*) and 9(*b*), with respect to the gate electrode 10*b* of the low voltage transistor region, desired ion implantation is performed, on a self-aligning basis and on an optional basis, to thereby form an LDD that becomes a low-concentration diffusion region 20 of the low voltage transistor. Incidentally, although not shown, injecting the LDD into the low voltage transistor region is performed as ion implantation after forming a photo-resist having openings in the NMOS/PMOS. More specifically, in the NMOS transistor, for example, arsenic (75 As$^+$) is ion implanted at a level of injection energy of 10 KeV and in an amount of injection that is on the order of $10^{14}$ cm$^{-2}$, to thereby form the LDD. On the other hand, in the PMOS transistor, for example, boron difluoride (49BF$_2^+$) is ion implanted at a level of injection energy of 10 KeV and in an amount of injection that is on the order of $10^{14}$ cm$^{-2}$, to thereby form the LDD. Also, injection of Halo for suppressing the short-channel effect in each of the both NMOS/PMOS may be performed simultaneously. At this time, injection of the LDD with respect to the low voltage transistor is performed with the outside side surface of the second side wall film 13 acting as the boundary.

For this reason, for preventing the deterioration in the performance of the low voltage transistor, so long as there is the effect of an etch stopper, the thinner the second side wall film 13, the more preferable it is (in this first embodiment 10 nm or less). If the third side wall film 14 is removed using only the etchant containing HF (hydrofluoric acid) as in this first embodiment, reduction of the film when wet etching is performed is suppressed. This enables thinning the silicon nitride film (the second side wall 13) that functions as a stopper film to 10 nm or less. As a result of this, it is possible to obtain a good logic transistor that has less parasitic resistance. The above-described process steps for forming the LDD that are shown in FIGS. 9(*a*) and 9(*b*) correspond to a fifth series of process steps of the invention method.

Figure 10:
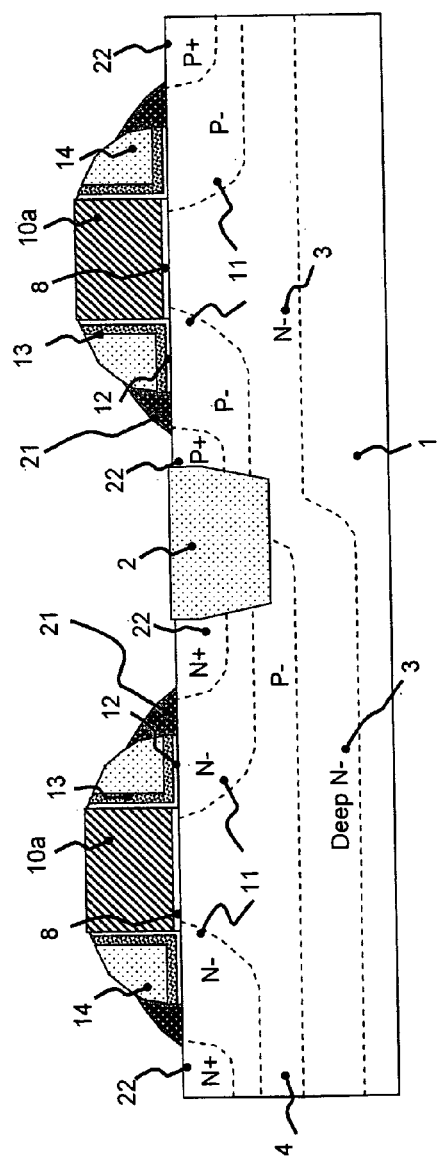
FIGS. 10(a) and 10(b) are sectional views of process step illustrating in the order of process steps the process of fabricating the high breakdown voltage transistor and low voltage transistor in the embodiment of a method of manufacturing the semiconductor device according to the present invention.
Figure 10:
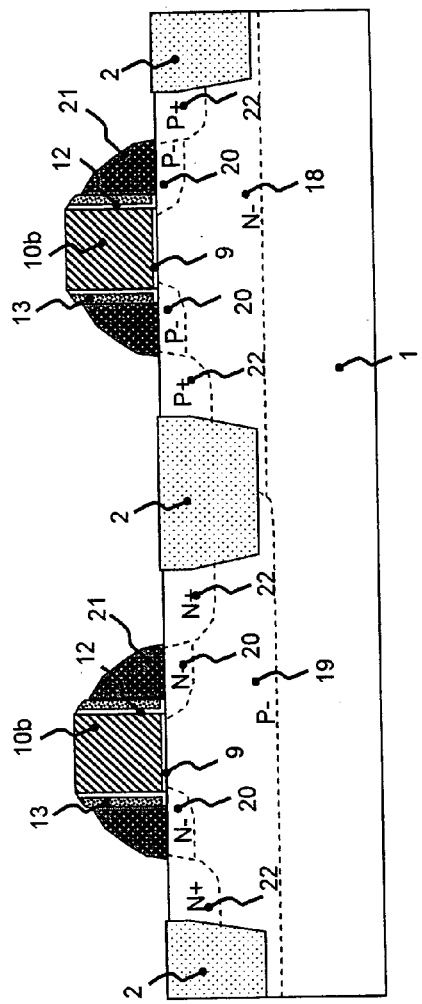
Figure 11:
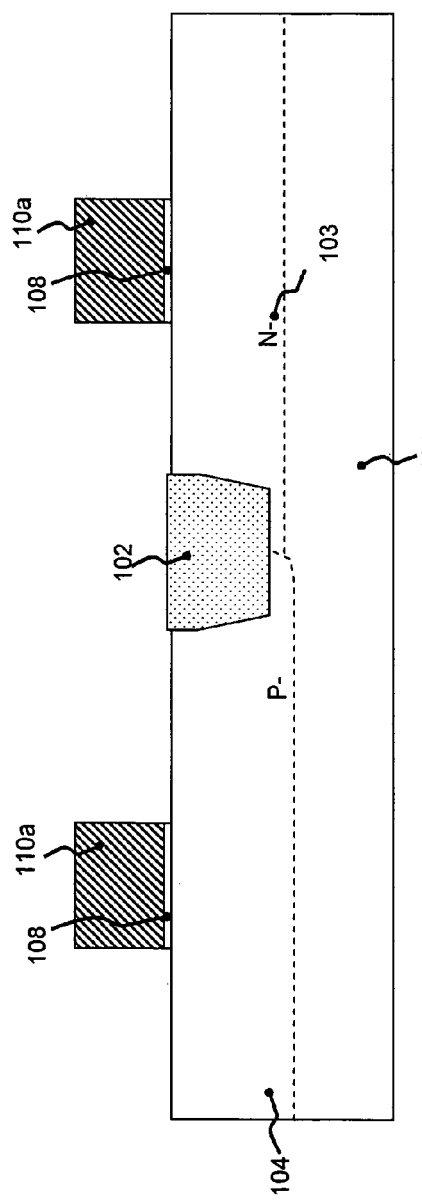
FIGS. 11(a) and 11(b) are sectional views of process step illustrating in the order of process steps the process of fabricating a high breakdown voltage transistor and low voltage transistor in a conventional method of manufacturing a semiconductor device.
Figure 11:
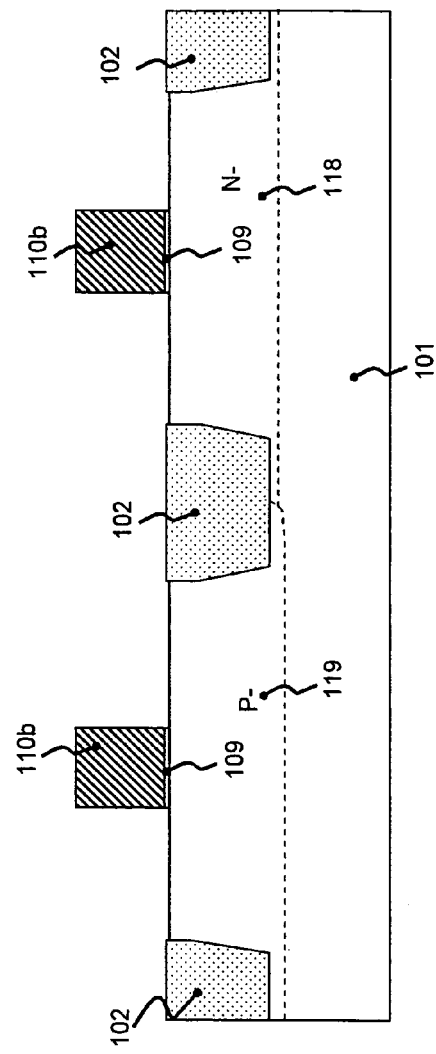
Figure 12:
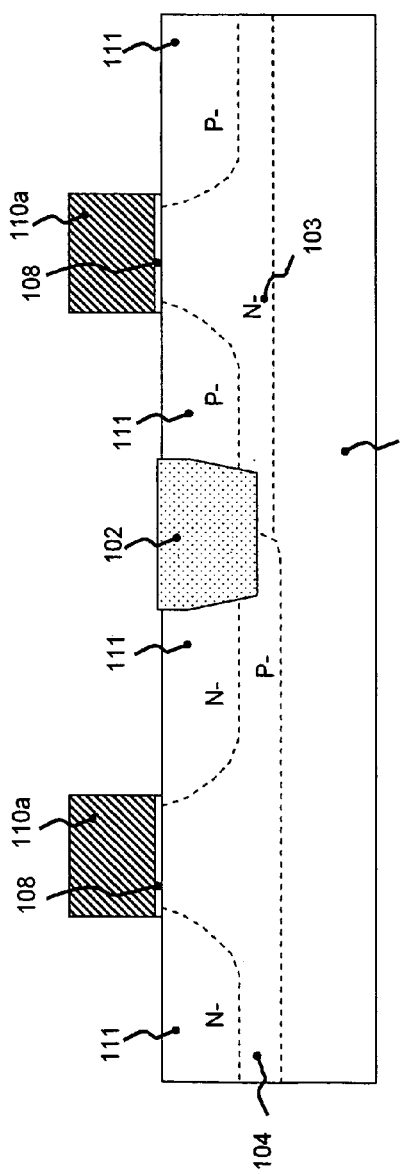
FIGS. 12(a) and 12(b) are sectional views of process step illustrating in the order of process steps the process of fabricating a high breakdown voltage transistor and low voltage transistor in the conventional method of manufacturing a semiconductor device.
Figure 12:
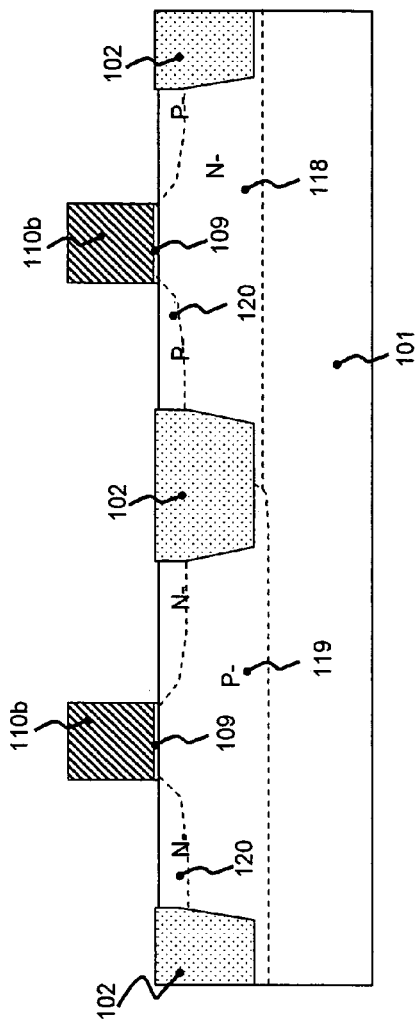
Figure 13:
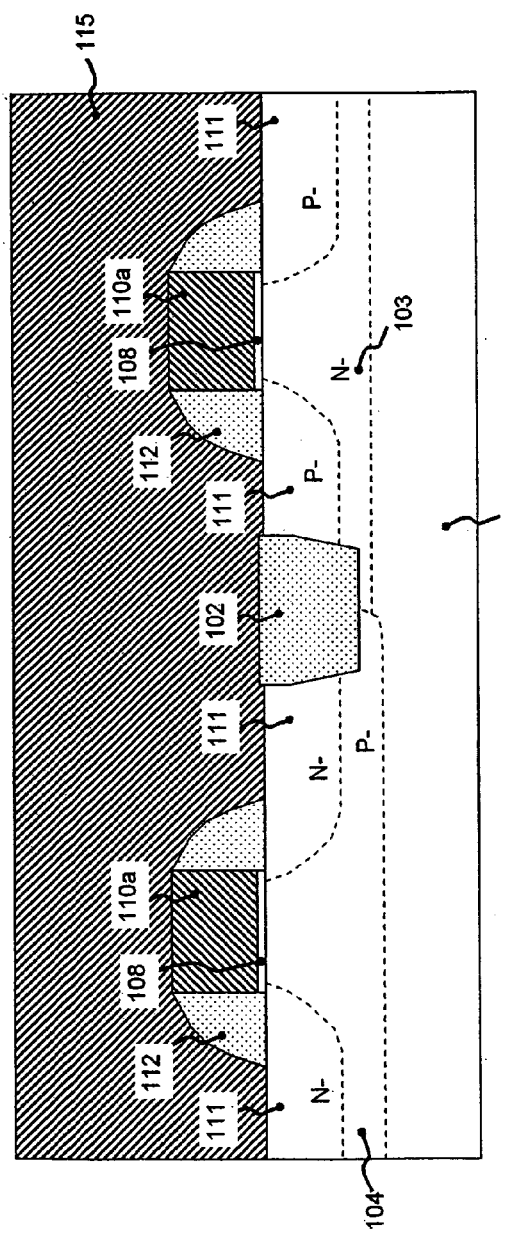
FIGS. 13(a) and 13(b) are sectional views of process step illustrating in the order of process steps the process of fabricating a high breakdown voltage transistor and low voltage transistor in the conventional method of manufacturing a semiconductor device.
Figure 13:
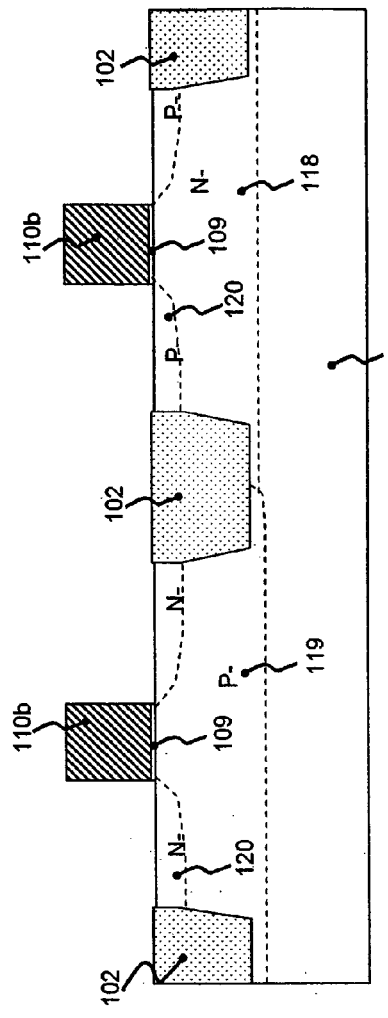
Figure 14:
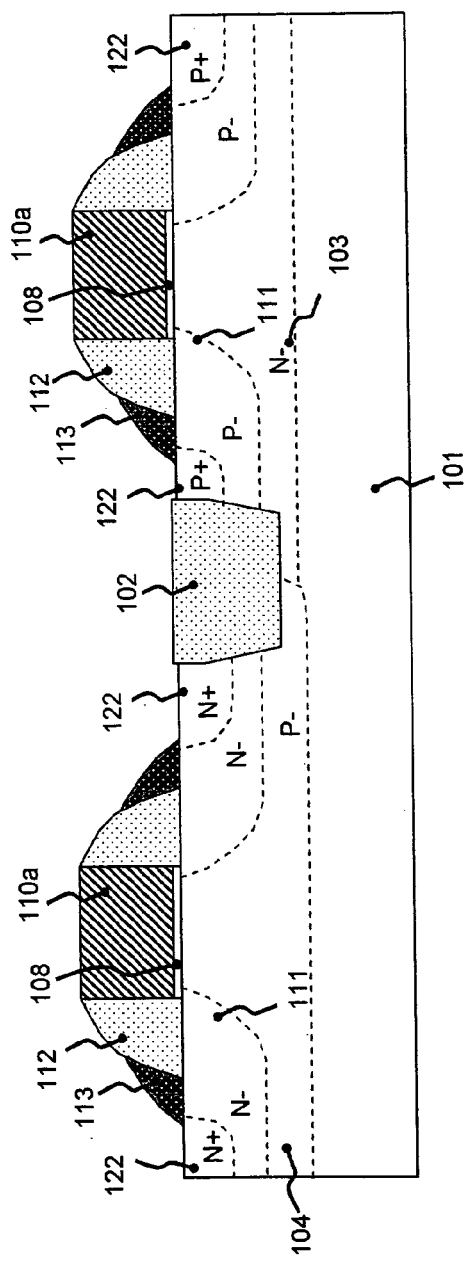
FIGS. 14(a) and 14(b) are sectional views of process step illustrating in the order of process steps the process of fabricating a high breakdown voltage transistor and low voltage transistor in a conventional method of manufacturing a semiconductor device.
Figure 14:
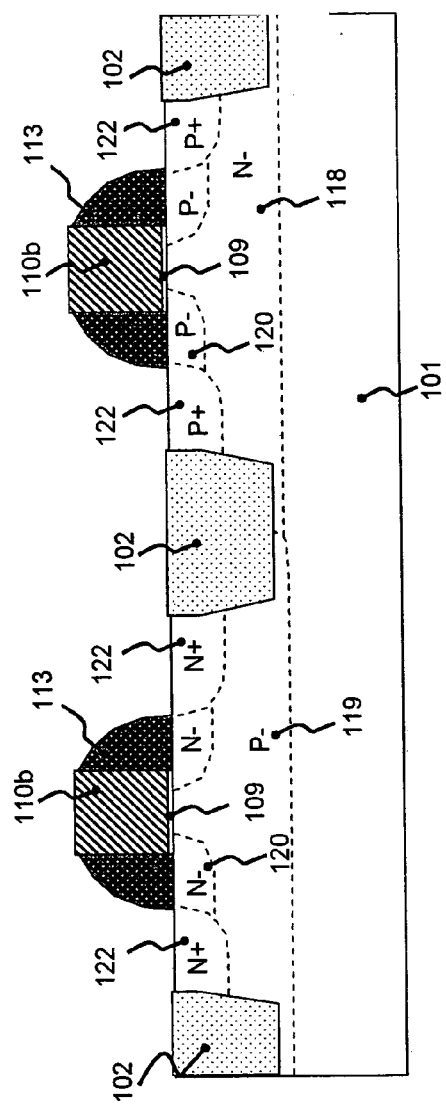

Next, as shown in FIGS. 10(*a*) and 10(*b*), in the both regions of the high breakdown voltage transistor region (a) and low voltage transistor (b), as a fourth side wall film 21, a silicon oxide film the thickness of that is, for example, 100 nm is deposited. Subsequently, anisotropic etching is selectively performed on the resulting mass. By doing so, the fourth side wall film 21 is left, as a side wall, on the side wall of the gate electrode. Incidentally, regarding the fourth side wall film 21, if it is an insulative film, the material for it is not limited to the silicon oxide film. It may be a silicon nitride film, or a silicon nitride oxide film, or a laminated film based on arbitrarily combining these materials. Incidentally, although needless to say, the same effect is brought about even in a case where the third side wall film 14 and fourth side wall film 21 are both a silicon oxide film and no discrimination can be made of that interface.

After that, in the both regions of high breakdown voltage transistor region (a) and low voltage transistor (b), using the gate electrodes 10*a* and 10*b* and the side walls 12, 13, 14 and 21 and 12, 13, and 21 as the mask, ion implantation is performed in such a way as self-alignment occurs, and, diffusion is performed for activation, to thereby form high-concentration source/drain diffusion layers 22. If doing so, the substrate has a sectional structure such as that which is shown in FIGS. 10(*a*) and 10(*b*). The above-described side-wall-forming process steps for the fourth side wall film 21 and the diffusion-layer-forming process steps for the high-concentration source/drain regions correspond to a six series of process steps of the invention method.

After that, although not shown, saliciding is performed with respect to the surface of the silicon substrate and that of the gate electrode, to thereby form an insulative film over the entire surface of the resulting mass using a CVD technique or the like for covering it. After that, contact holes are formed, then electrically conductive films are embedded there, and then desired electrodes are connected to there, to obtain the invention device.

(Second Embodiment)

Although in the above-described first embodiment an explanation has been given of a case where there exist two types of transistors the widths of whose side walls are different, i.e. the high breakdown voltage transistor (a) and low voltage transistor (b), the invention device and invention method can also be applied in a case where, in addition to the high breakdown voltage transistor (a) and low voltage transistor (b), there is provided a floating gate type memory cell transistor for use for a non-volatile semiconductor memory, with the result that the resulting semiconductor device has co-loaded therein the non-volatile semiconductor memory such as a flash memory.

Here, if process steps for forming a memory cell transistor are suitably inserted into between after the execution of the side wall forming steps (the above-described third series of process steps) for the first to third side wall films 12, 13, and 14 of the high breakdown voltage transistor (a) and before the execution of the LDD forming steps (the above-described fifth series of process steps) of the low voltage transistor (b), the non-volatile semiconductor memory can easily be loaded.

In this case, since the side walls of a control gate and floating gate of the memory cell transistor come to be composed by only the fourth side wall film 21 alone, reducing the memory cell size can be achieved. Also, the side walls of the control gate and floating gate are not limited to using the fourth side wall film 21 only. Even if, for example, an insulative film such as a silicon oxide film, etc. is formed inside the fourth side wall film 21, no inconvenience arises and it is possible to obtain the same effect of reducing the memory cell in size.

(Third Embodiment)

In each of the above-described first and second embodiments, as the side walls of the high breakdown voltage transistor (a), the four layers of the silicon oxide film (the first side wall film 12), silicon nitride film (the second side wall film 13), silicon oxide film (the third side wall film 14), and silicon oxide film (the fourth side wall film 21) have been formed in the way of being sequentially laminated, and as the side walls of the low voltage transistor (b), the three layers of silicon oxide film (the first side wall film 12), silicon nitride film (the second side wall film 13), and silicon oxide film (the fourth side wall film 21) have been formed in the way of being sequentially laminated. However, in the side walls of each of the high breakdown voltage transistor (a) and low voltage transistor (b), providing the silicon oxide film (the first side wall film 12) is not always needed. In this case, since the thickness of the silicon oxide film (the first side wall film 12) is as small as approximately 5 nm, so long as the silicon nitride film (the second side wall film 13) functions as the etch stopper film, even if there is not the silicon oxide film (the first side wall film 12), the same effects as in the above-described first and second embodiments are brought about.

Incidentally, when embodying the method of the present invention, it is possible to embody, by making suitable alteration or modifications of the manufacturing process steps and manufacturing conditions that have been shown in the first to third embodiments, without departing from the scope of technical idea that is involved in the invention method. For example, ion implantation (the above-described second series of process steps) for forming the low-concentration diffusion layer of the high breakdown voltage transistor (a) is not limited to the order of processing in each of the above-described embodiments. That ion implantation may be performed after the formation of the first side wall film 12 that is midway in the above-described third series of process steps (before the formation of the second side wall film 13).

As has been explained above in detail, according to the semiconductor device and the manufacturing method therefor according to the present invention, in the high breakdown voltage transistor region, the deterioration in the junction breakdown voltage can be prevented. Also, in the low voltage transistor, it is possible to ensure a high magnitude of electric current for driving. Furthermore, since when eliminating the side walls of the low voltage transistor protecting the element isolation insulative film by the stopper film, it is possible to obtain a semiconductor device that is high in performance and high in manufacturing yield, such as a logic co-loaded non-volatile memory.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A semiconductor device comprising:
   a high breakdown voltage transistor and a low voltage transistor the widths of whose side walls are different from each other;
   the side walls of the high breakdown voltage transistor including four layers of first side wall film, second side wall film, third side wall film, and fourth side wall film that are formed in such a way that they are laminated in a sequential order from both side surfaces of a gate electrode in directions that are sidewardly remote away from this gate electrode;
   the side walls of the low voltage transistor including three layers of the first side wall film, the second side wall film, and the fourth side wall film that are formed in such a way that they are laminated in a sequential order from both side surfaces of a gate electrode in directions that are sidewardly remote away from this gate electrode, wherein
   the first side wall film is made of different material than the second side wall film, and
   the second side wall film is made of different material than the third side wall film and the fourth side wall film.

2. The semiconductor device according to claim 1, wherein the second side wall film is a silicon nitride film; and the third side wall film is a silicon oxide film.

3. The semiconductor device according to claim 1, wherein the second side wall film is formed in the way of having a width of 10 nm or less.

4. A semiconductor device comprising:
   a high breakdown voltage transistor and a low voltage transistor the widths of whose side walls are different from each other;
   the side walls of the high breakdown voltage transistor including four layers of first side wall film, second side wall film, third side wall film, and fourth side wall film that are formed in such a way that they are laminated in a sequential order from both side surfaces of a gate electrode in directions that are sidewardly remote away from this gate electrode;
   the side walls of the low voltage transistor including three layers of the first side wall film, the second side wall film, and the fourth side wall film that are formed in such a way that they are laminated in a sequential order from both side surfaces of a gate electrode in directions that are sidewardly remote away from this gate electrode, wherein
   the second side wall film is a silicon nitride film, and the third side wall film is a silicon oxide film.

5. The semiconductor device according to claim 4, wherein the second side wall film is formed in the way of having a width of 10 nm or less.

* * * * *